(12) United States Patent
Witchard

(10) Patent No.: US 7,920,023 B2
(45) Date of Patent: Apr. 5, 2011

(54) SWITCHING AMPLIFIER

(75) Inventor: Clyde Witchard, Bristol (GB)

(73) Assignee: New Transducers Limited (GB)

( * ) Notice: Subject to any disclaimer, the term of this patent is extended or adjusted under 35 U.S.C. 154(b) by 21 days.

(21) Appl. No.: 12/440,130

(22) PCT Filed: Aug. 31, 2007

(86) PCT No.: PCT/GB2007/003288
§ 371 (c)(1),
(2), (4) Date: Aug. 19, 2009

(87) PCT Pub. No.: WO2008/029091
PCT Pub. Date: Mar. 13, 2008

(65) Prior Publication Data
US 2010/0045377 A1 Feb. 25, 2010

(30) Foreign Application Priority Data
Sep. 5, 2006 (GB) .................................. 0617437.9

(51) Int. Cl.
*H03F 3/38* (2006.01)
(52) U.S. Cl. .......................................................... 330/10
(58) Field of Classification Search .................. 330/10; 375/238, 239
See application file for complete search history.

(56) References Cited

U.S. PATENT DOCUMENTS

| | | | |
|---|---|---|---|
| 4,240,036 A * | 12/1980 | Kohler | 330/10 |
| 4,908,857 A * | 3/1990 | Burns et al. | 379/418 |
| 6,176,611 B1 | 1/2001 | Schushan et al. | |
| 2003/0193843 A1 | 10/2003 | Krahe et al. | |
| 2005/1168205 | 8/2005 | Dwarakanath et al. | |
| 2005/0280458 A1 | 12/2005 | Leung et al. | |
| 2006/0077011 A1 | 4/2006 | Kirn | |

FOREIGN PATENT DOCUMENTS

| | | |
|---|---|---|
| EP | 0 525 777 A | 2/1993 |
| EP | 0 586 256 A | 3/1994 |
| GB | 2 343 573 A | 5/2000 |
| GB | 2 403 082 A | 12/2004 |
| GB | 2 406 008 A | 3/2005 |
| WO | WO 2005/086161 A | 9/2005 |
| WO | WO 97/48185 A | 12/2007 |

OTHER PUBLICATIONS

International Search Report for PCT/GB2007/003288 dated Apr. 4, 2008.

* cited by examiner

*Primary Examiner* — Steven J Mottola
(74) *Attorney, Agent, or Firm* — Myers Bigel Sibley & Sajovec

(57) ABSTRACT

A switching amplifier includes a modulator, which includes a pulse generator. The pulse generator generates positive and negative pulses, in response to an input signal, and the frequency of the negative pulses can be controlled independently of the frequency of the positive pulses. The positive pulses and negative pulses are combined to form a composite pulse stream, which can be low-pass filtered such that the filter output is an amplified version of the input signal.

29 Claims, 9 Drawing Sheets

SWITCHING AMPLIFIER

RELATED APPLICATIONS

This application is a 35 U.S.C. §371 national stage application of PCT Application number PCT/GB2007/003288, filed Aug. 31, 2007, which claims priority from Great Britain Patent Application No. 0617437.9, filed Sep. 5, 2006, the disclosure and content of each of which are incorporated by reference in their entireties. The above-referenced PCT International Application was published in the English language as international Publication No. WO 2008/029091 on Mar. 13, 2008.

BACKGROUND

Switching amplifiers, also known as Class D amplifiers, are seeing increasing interest and development due to their substantial power efficiency advantages over conventional linear amplifier architectures. Essentially, switching amplifiers use a binary digital approach, exploiting the well-established principle that the amplifier's transistors waste least power when either on or off, rather than part-way between the two, as is the case in a traditional linear amplifier. The switching amplifier is a development of the switched-mode power supply (SMPS).

As is known, in a switching amplifier, a sequence of pulses is generated, and applied to a low pass filter, such that the filtered pulse sequence forms an amplified version of the input signal. Within this simple principal, many types of on-off pulse pattern can be employed. However, the vast majority of existing switching amplifier designs use pulse width modulation (PWM), in which a stream of rectangular pulses of fixed frequency is generated, and the on-to-off duty cycle of the pulses is varied to achieve the required average amplitude.

Whilst it is true that switching amplifiers waste little power when their transistors are either fully switched on, or fully switched off, efficiency problems arise in existing designs due to switching between the on and off states. In the switching transition interval, the transistors conduct a non-zero current across a non-zero voltage potential, thus dissipating heat, with the instantaneous wasted power being the product of the current and voltage. These switching losses are the predominant cause of wasted power in PWM amplifiers and other existing switching amplifiers. These losses are compounded by the fact that the voltages switched are frequently large.

Another method for generating the on-off switching pattern is sigma delta modulation (SDM), also known as pulse density modulation (PDM). However, SDM requires a much higher switching rate than PWM, and hence it incurs much higher switching power losses. These losses are usually unacceptable in amplifier applications, so SDM is seen mainly in non-power applications, such as digital-to-analogue converters (DACs). In an attempt to counter the switching power losses of SDM, amplifier architectures have been proposed that make use of quasi-resonant conversion (QRC). QRC is a SMPS technique that massively reduces the per-pulse switching energy loss. Rather than rectangular pulses, QRC produces fixed-width sinusoidal (or near-sinusoidal) pulses, and the power savings are made from the fact that the switching elements are only ever transitioned when either the current through them is near-zero, or the voltage across them is near-zero; hence the per-pulse switching loss is near-zero.

However, QRC does not apply itself efficiently to SDM. Its fixed-width pulses require that one pulse is needed for every basic clock interval of the pulse stream. For example, an "on" period in a normal SDM switching waveform that lasts for three basic clock cycles would be represented by three contiguous positive QRC pulses. For this reason, the switching rate of the SDM QRC implementations is even higher than already high rate of standard SDM. The result is that the per-pulse efficiency benefits of QRC can be outweighed by the much higher switching rate.

In summary, existing switching amplifiers suffer from substantial switching power losses in one form or another. These are often not apparent from the high "headline" amplifier efficiency figures that one may find quoted, as these are frequently measured using a test signal that is close to full-scale. As the amplitude of the signal is reduced, however, switching losses rapidly dominate over the power delivered to the load. This is a particular problem for high peak-to-average-power-ratio (PAPR) signals, such as audio signals, and particularly if the amplified signals have been pre-processed by a variable-gain stage, such as an audio volume control. The long-term average efficiency of existing amplifiers for such signals is low, leading to short operating lifetime in battery-powered applications, and cost and size overheads for power components and heat-removal systems.

SUMMARY

According to a first aspect of the present invention, there is provided a modulator, for use in a switching amplifier, the modulator comprising:

a pulse generator, for supplying a composite pulse stream, wherein the composite pulse stream contains:

positive pulses, having positive mean amplitudes and having a controllable first pulse frequency, and negative pulses, having negative mean amplitudes and having a second pulse frequency that is controllable independently of the first pulse frequency.

According to a second aspect of the present invention, there is provided a switching amplifier, comprising:

a modulator in accordance with the first aspect of the invention and a filter, wherein the composite pulse stream is applied to the filter, such that an output signal of the filter is an amplified version of said input signal.

According to a third aspect of the present invention, there is provided a method of operation of a switching amplifier, the method comprising, in response to an input signal:

generating positive pulses having positive mean amplitudes and having a controllable first pulse frequency;

generating negative pulses having negative mean amplitudes and having a second pulse frequency that is controllable independently of the first pulse frequency;

combining the positive pulses and the negative pulses to form a composite pulse stream; and applying the composite pulse stream to a low pass filter, such that an output of the filter is an amplified version of the input signal.

According to a fourth aspect of the present invention, there is provided a method for determining a time at which a signal, represented by a sequence of sample values, crosses a threshold value, the method comprising:

a. deciding whether or not a number of contiguous input samples are sufficiently close to the form of a straight line; and b. if said contiguous input samples are sufficiently close to the form of a straight line, performing linear interpolation to determine the time at which the threshold is crossed, or c. if said contiguous input samples are not sufficiently close to the form of a straight line, performing a more accurate form of interpolation to generate one or more new sample points around the threshold crossing point, and returning to step a.

According to a fifth aspect of the present invention, there is provided a digital timer, taking as input a digital time value and outputting a trigger event at that time, comprising:

a lower precision timer operating from a slower clock, and a higher precision timer operating from a faster clock, arranged such that the lower precision timer is always activated and times a larger part of the time before the output trigger event, and the higher precision timer is activated by the lower precision timer for only a shorter part of the time before the output trigger event, the higher precision timer outputting the trigger event.

We thus present a novel pulse frequency modulation (PFM) system that employs bipolar pulses, a technique that we term bipolar PFM (BPFM). BPFM can achieve an average switching rate as low as, or lower than, PWM for high PAPR input signals. Moreover, since the scheme uses fixed-width pulses it is directly and efficiently applicable to QRC techniques, without recourse to contiguous runs of QRC pulses as described above. This allows a switching amplifier using BPFM to benefit from the advantages of QRC, including the almost total elimination of per-pulse switching losses, and greatly reduced electromagnetic interference (EMI) compared to rectangular pulse methods.

Additionally, we propose a novel scheme for a high precision, low power timer, that offers much higher timing precision than is available from a standard digital system clock. For our BPFM application, this allows much more accurate timing of the PFM pulses, improving signal fidelity by increasing the signal-to-noise ratio (SNR) and reducing the total harmonic distortion (THD).

According to a sixth aspect of the present invention, there is provided a modulator, for use in a switching amplifier, the modulator comprising:

an input for receiving an input signal; and a pulse generator, for supplying a pulse stream, having a controllable pulse frequency, the pulse frequency being the sum of a carrier frequency and a modulated frequency; and means for controlling the modulated frequency based on an amplitude of the input signal, such that the amplifier produces a desired average pulse amplitude; and means for controlling the carrier frequency, so as to minimize its value, while maintaining an acceptable level of distortion of the input signal when the pulse stream is applied to a low pass filter.

According to a seventh aspect of the present invention, there is provided a modulator, for use in a switching amplifier, the modulator comprising:

an input for receiving an input signal; and a pulse generator, for supplying a pulse stream, having a controllable pulse frequency, the pulse frequency being the sum of a carrier frequency and a modulated frequency; and means for controlling the modulated frequency based on an amplitude of the input signal, such that the amplifier produces a desired average pulse amplitude; and means for using quasi-resonant conversion to form said pulses.

There are thus provided systems that allow the use of pulse frequency modulation at acceptably low switching rates and distortion levels.

BRIEF DRAWING DESCRIPTION

For a better understanding of the present invention, and to show how it may be put into effect, reference will now be made, by way of example, to the accompanying drawings, in which.

DETAILED DESCRIPTION

Figure 1:
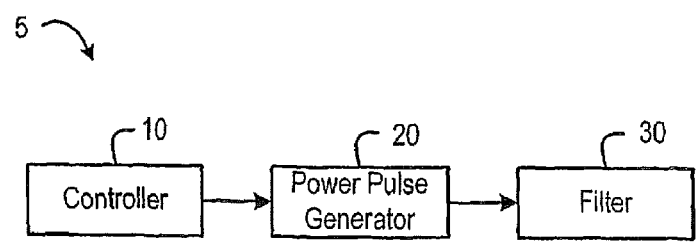
FIG. 1 is a block schematic diagram of an amplifier in accordance with an aspect of the present invention.

FIG. 1 illustrates an amplifier arrangement 5 in accordance with an embodiment of the present invention. An input signal, that is intended to be amplified, is applied to a controller 10. As will be described in more detail below, the controller 10 determines a scheme for controlling the amplifier arrangement, such that the input signal is amplified efficiently and accurately, and produces a controller output signal.

The controller output signal is applied to a power pulse generator 20, for generating pulses in accordance with the scheme determined by the controller 10. The controller 10 and the power pulse generator 20 can together be considered as a modulator. The pulses output by the power pulse generator 20 are passed to a low pass filter 30. In some embodiments of the invention, the power pulse generator 20 is a quasi-resonant converter, which produces fixed-width sinusoidal (or near sinusoidal) pulses. In any event, the exact form of the power pulse generator may be generally conventional, and will not be described further herein. The filter 30 itself is generally conventional, and will not be described further herein. Although the filter 30 is shown here as a separate component, such a component may not be required. For example, where the output signal is to be applied to a load having suitable filtering characteristics, then the pulses generated by the power pulse generator 20 may be applied directly to the load. For example, where the amplifier 5 is to be used as an audio amplifier, then a load in the form of an inductive loudspeaker coil may provide suitable low pass filtering, allowing the pulses to be applied directly to the load.

Figure 2:
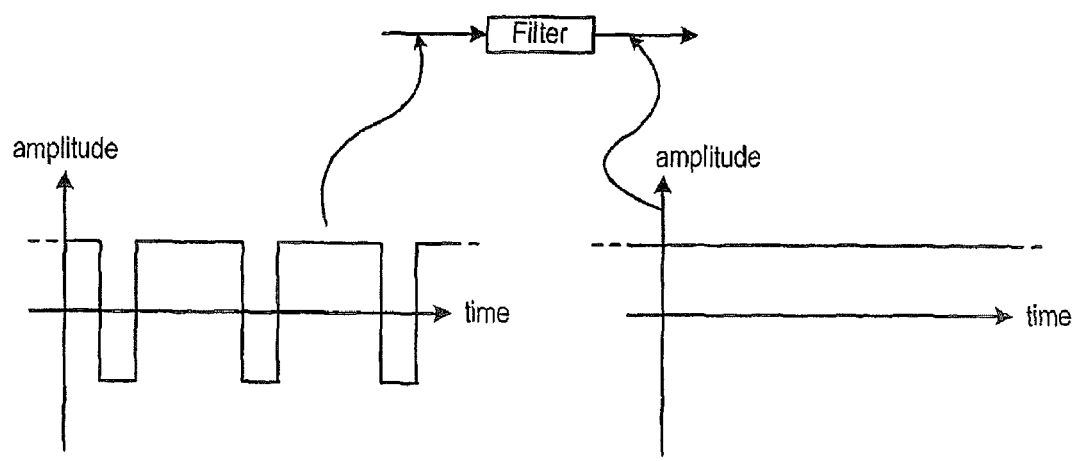
FIG. 2 illustrates a pulse sequence, for explanation of the amplifier of the present invention.

The principles of operation of the amplifier arrangement 5 are explained with reference to FIG. 2. It will be noted that FIG. 2, and subsequent Figures, show rectangular pulses. However, as mentioned above, the use of a power pulse generator 20 in the form of a quasi-resonant converter producing sinusoidal pulses may be preferred. The description with reference to a rectangular pulse stream is therefore simply for ease of illustration. More generally, any pulse stream can be fed into an averaging filter, and the output of the averaging filter is linearly dependent on the average amplitude of the pulse stream. So, for example, in FIG. 2 a 100% on-to-off duty cycle would result in full-scale positive output after the filter, a 0% on-to-off duty cycle would result in full-scale negative output, and a 50% on-to-off duty cycle would result in zero output.

Thus, by generating a suitable pulse stream in response to an input signal, the output of the averaging filter can be made to be an amplified version of the input signal.

Figure 3:
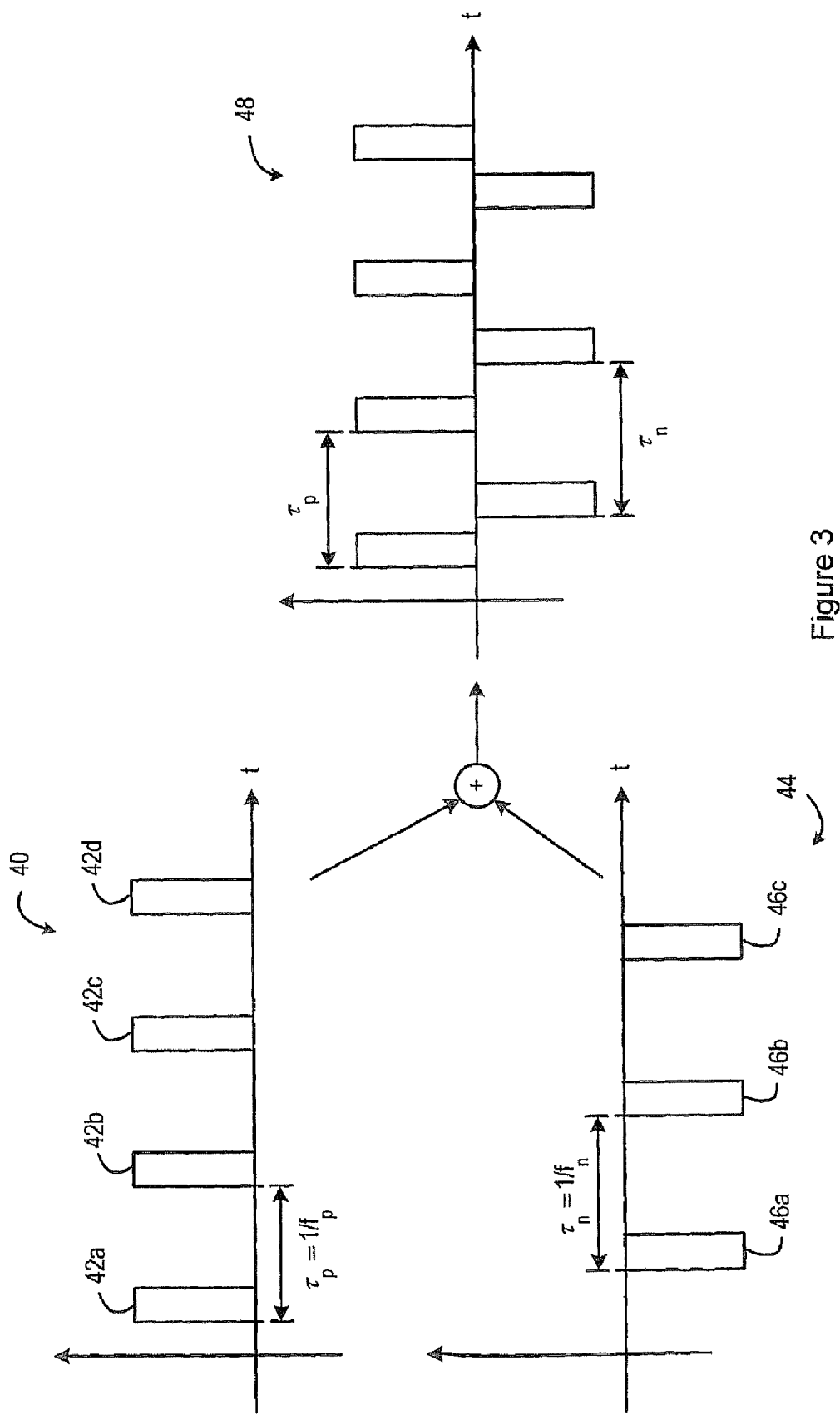
FIG. 3 illustrates further pulse sequences, for explanation of the amplifier of the present invention.

FIG. 3 illustrates the operation of the controller 10 and the power pulse generator 20 in the amplifier arrangement 5. Specifically, FIG. 3 illustrates a first, positive, PFM pulse stream 40, made up of pulses 42a, 42b, 42c, 42d etc, and having a fixed pulse period $\tau_p$, and hence a fixed pulse frequency, $f_p=1/\tau_p$, as shown in FIG. 3. The particular pulses shown in the diagram are rectangular, but note that all of the techniques presented here are applicable to a repeated pulse stream having pulses of any shape, assuming the same width and amplitude for every repetition of the pulse. In particular, while the pulses 42a, 42b, 42c, 42d are described as positive pulses, any pulses having positive average amplitudes can be regarded as positive pulses.

FIG. 3 also shows a second, negative, PFM pulse stream 44, made up of pulses 46a, 46b, 46c, etc, and having a fixed pulse period $\tau_n$, and hence a fixed pulse frequency, $f_n=1/\tau_n$, as shown in FIG. 3. The negative pulses can be assumed to be identical but inverted versions of the pulses in the positive pulse stream.

Further, FIG. 3 shows a composite pulse stream 48, formed by adding together the pulses 42a, 42b, 42c, 42d of the first pulse stream 40 and the pulses 46a, 46b, 46c of the second pulse stream 44.

The result of generating the composite pulse stream 48 in the amplifier 5 can be seen by considering the result of applying the composite pulse stream 48 to a filter, such as the low pass filter 30. For ease of illustration, this can be assumed to be an ideal low-pass filter with cut-off frequency $f_x$, where $f_x<f_p$ and $f_x<f_n$. That is, we can assume that the filter has unity gain for frequency components less than $f_x$, and zero gain for frequency components greater than $f_x$.

We can define a differential frequency, $f_{diff}$ as $(f_p-f_n)$. Then, the amplitude, a, of the ideal filter output signal equals the average amplitude of the pulse stream signal. We find that:

$a=k\cdot f_{diff}$, where k is a positive constant.

We can also define the common mode frequency, $f_{cm}$, as:

$f_{cm}=(f_p+f_n)/2$.

It can be noted that a is independent of $f_{cm}$. However, in a real pulse frequency modulator, or a power pulse-forming stage driven by the modulator, there is a large component of power loss proportional to the average pulse rate, i.e. $f_{cm}$. This is due to the per-pulse energy losses, which are typically a combination of switching losses, as switching components transition between the on and off states, and conduction losses in components that conduct current as the pulse is formed. Thus, to minimize power losses, it is desirable to keep $f_{cm}$ as low as possible.

However, to maintain a faithful representation of the original signal, it is important to minimize any extraneous frequency components below $f_x$ produced by the pulse frequency modulation process. The ratio of the total power of these unwanted components, compared to the power of the wanted signal, is termed the total sideband distortion (TSD). For the DC case, it is trivial to see that we simply need to maintain $f_p>f_x$ and $f_n>f_x$, implying $f_{cm}>f_x$, and the ideal filter will remove all the pulse harmonics, leaving just the wanted DC value, i.e. the bipolar pulse frequency modulator (BPFM) will yield zero TSD.

The AC case is harder to analyse, but this is considered below. To allow discussion of the AC case, we allow several variables become functions of time. Specifically, a, $f_{cm}$, $f_{diff}$, $f_n$, and $f_p$ become a(t), $f_{cm}(t)$, $f_{diff}(t)$, $f_n(t)$, and $f_p(t)$ respectively.

As mentioned above, it is desirable to keep $f_{cm}(t)$ at a low value whenever the input signal to be amplified, x(t), is small, and therefore yield high power efficiencies for high PAPR signals, but it is also desirable to maintain a low TSD.

In one method, termed the semi-static method, we choose a fixed base frequency, $f_b$, that sets the lowest value that can be taken by $f_p(t)$ or $f_n(t)$. The fixed base frequency $f_b$ is chosen to be marginally greater than the filter cut-off frequency $f_x$. Depending on the sign of x(t), the frequency of either the positive pulse stream, or the negative pulse stream, is held at $f_b$. The frequency of the other pulse stream is varied to a value higher than $f_b$ to set $f_{diff}(t)$, and hence a(t), to the required value.

So, for $x(t) \geq 0$, we set:

$f_p(t)=f_b+m\cdot x(t)$, where m is a positive constant, and $f_n(t)=f_b$.

For x(t)<0, we set:

$f_p(t)=f_b$, and $f_n(t)=f_b-m\cdot x(t)$

Thus, as required, in each case:

$f_{diff}(t)=m\cdot x(t)$

Clearly, for the DC case all pulse harmonics are removed by the ideal filter, since $f_p(t) \geq f_b > f_x$ and $f_n(t) \geq f_b > f_x$. Thus, for the DC case:

$a(t)=k\cdot f_{diff}(t)=k\cdot m\cdot x(t)$

This DC model also forms a good approximation for low bandwidth or small AC signals, with a higher value of $(f_b-f_x)$ being required as the signal bandwidth or amplitude is increased.

As described above, the base frequency, $f_b$, is fixed. However, in some embodiments of the invention, the base frequency, $f_b$, can be dynamically adjusted, for example on the basis of measurements of the signal bandwidth and/or amplitude.

It can be seen that, for small signals, $f_{cm}(t)$ remains close to the low frequency $f_b$, and hence the power consumed by per-pulse losses is small.

In another method, termed the balanced method, the frequencies of the two pulse streams, $f_p(t)$ and $f_n(t)$, are varied in anti-phase so as to keep the common mode frequency $f_{cm}(t)$ equal to a desired carrier frequency $f_c(t)$.

Thus:

$f_p(t)=f_c(t)+m\cdot x(t)/2$ $f_n(t)=f_c(t)-m\cdot x(t)/2$.

Therefore, as required:

$f_{diff}(t)=m\cdot x(t)$.

The carrier frequency, $f_c(t)$, can either be kept at a fixed value for all t, or can be varied with time so as to keep its value as low as possible whilst maintaining an acceptable TSD. Clearly, the first option is the simplest. However, in order to minimize power losses, the second option may be preferred.

For this balanced BPFM, it is possible to extend the classic sinusoidal frequency modulation (FM) analysis that is usually applied to analogue FM communication systems. From this analysis, it is possible to derive a general method for adapting $f_c(t)$, based on the amplitude and frequency content of x(t), so as to optimally strike the compromise between a low value of $f_c(t)$ and a low TSD. We term this approach adaptive BPFM (ABPFM).

In the classic FM analysis, a sinusoid of frequency $f_c$ is modulated by a sinusoid of frequency $f_m$, and peak frequency deviation $\Delta f$. It is found that the modulation gives rise to an infinite series of sideband frequency components either side of $f_c$, spaced at integer multiples of $f_m$ away from $f_c$. The sideband component amplitudes are shaped by a Bessel function, which causes the sideband power to drop very rapidly beyond a certain point; so, although the theory describes sideband components that are spread over an infinite bandwidth, in practice the FM signal can be considered to occupy only a finite bandwidth. The key characteristic, for our purposes, is that the effective bandwidth of the FM signal increases as either the modulating amplitude, represented by $\Delta f$, or the modulating frequency, $f_m$, is increased. For example, in communication systems, the effective bandwidth, W, is sometimes approximated by Carson's rule $$W \approx 2 \cdot (\Delta f + f_m)$$

Note that superposition does not apply to FM, so from a mathematical point of view one cannot strictly take this result for a sinusoidal modulating signal and additively synthesize the general result for an arbitrary modulating signal, as one could for amplitude modulation (AM), for example. However, in practice, for the purposes of estimating sideband power, such an approach does form a good approximation, and is often used. Therefore, for analogue FM radio, for example, we find that it is the high amplitude and high frequency components of the audio content that determine the effective bandwidth required.

It is possible to extend the classic sinusoidal FM analysis such that the carrier waveform, rather than being a continuous sinusoid, is a pulse stream, with repeated pulses of any shape (assuming the same pulse width and amplitude for every repetition of the pulse). It is then possible to further extend the analysis to the balanced BPFM case that we are considering here. It is found that the results are somewhat similar to the sinusoidal carrier case. Due to the PFM process, each harmonic of the pulse stream is effectively both frequency modulated and amplitude modulated (the amplitude modulation effect being due to the varying duty cycle that occurs in fixed pulse-width PFM). Therefore, FM-like sideband components are produced either side of each original harmonic of the pulse stream. However, it should be noted that the unwanted sideband power below $f_x$ is almost entirely due just to the lower sideband of the first harmonic of the pulse stream.

It should also be noted that significant advantages are gained by phase aligning the positive and negative pulses of the BPFM such that they coincide, and hence cancel, when the input signal, x(t), is zero. It is immediately seen that this leads to zero pulse output when the modulator is "at rest"—an advantage in itself—but more importantly, this phase relationship permanently cancels half the sideband components (the even numbered components), even when x(t) is non-zero. Most significantly, this includes cancellation of the original pulse harmonics themselves. Pulse harmonics are a substantial problem in existing switching amplifiers, leading to harmonic power losses in the output filter and load, and recognized EMI problems. The phase alignment technique just described avoids these problems, and it allows low-cost implementations to omit the output filter. Furthermore, regarding signal fidelity, the cancellation of half the sideband components leads to a factor of two reduction in TSD. Note that in some implementations, it may not be possible to exactly align the positive and negative pulse phases (see later), but if they are closely aligned most of the advantage is still gained—particularly in regard to cancellation of the first harmonic, which is the most troublesome for harmonic losses, yet its cancellation is the most tolerant of these pulse phase offsets.

As with the classic sinusoidal carrier FM analysis, for balanced BPFM it is found that the effective bandwidth of the sidebands of each pulse harmonic increases as either the modulating amplitude or the modulating frequency is increased. Again, although superposition does not strictly apply, it is a good approximation for sideband power estimation, and, as with analogue FM radio, it is seen that, for an arbitrary signal x(t), it is the high amplitude and high frequency components of x(t) that determine the effective sideband bandwidth, and thus the lowest value of $f_c(t)$ that can be tolerated for a particular maximum TSD.

This leads us to a general method for adapting the carrier frequency. However, it should first be noted that the carrier frequency must not be varied too rapidly. The analysis above is based on the assumption that the carrier frequency is fixed. For example, varying the carrier frequency can itself produces sidebands. However, if we ensure that $f_c(t)$ is slowly varying compared to $f_{diff}(t)$, then it is found that the fixed-carrier analysis holds well, e.g. any sidebands due to $f_c(t)$ are dominated by the sidebands due to $f_{diff}(t)$ that are already catered for.

Figure 4:
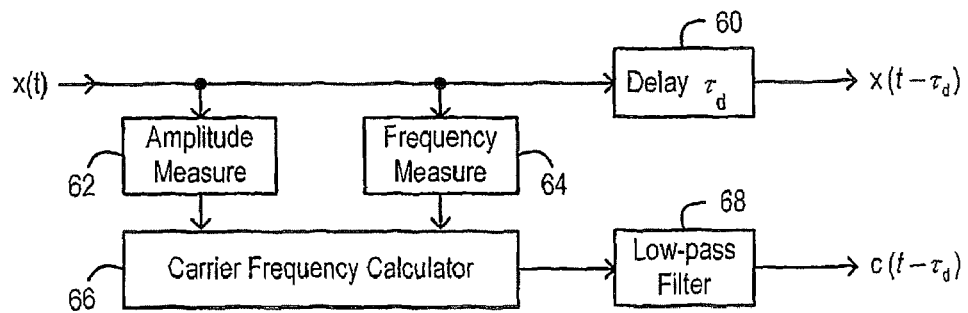
FIG. 4 is a block schematic diagram, illustrating a component of the amplifier of the present invention.

FIG. 4 shows a system for implementing a method for adapting the carrier frequency based on all of these considerations. An input signal x(t) is applied to a delay unit 60, which delays the signal by a time delay $\tau_d$, which is selected to be long enough to allow time for measurements to be made on the input signal x(t) and processed, as described below. Specifically, the input signal x(t) is also applied to an amplitude measurement block 62, which measures the amplitude of x(t), and a frequency measurement block 64, which measures its frequency content, and specifically its high-frequency content.

These measures are then fed into a carrier frequency calculator unit 66 that calculates a value for the carrier frequency. The greater the amplitude of x(t), or the greater the high-frequency content of x(t), the larger the value output by the unit. Finally, to ensure that changes in carrier frequency are not too fast, the values are passed through a low-pass filter 68. For convenience later, the carrier frequency is output in terms of c(t), where:

$$f_c(t) = m \cdot c(t)$$

Within this general scheme, many particular implementation options are available.

As one example, the amplitude measurement block 62 could measure the peak absolute amplitude that has occurred in some recent time interval, and the frequency measurement block 64 could be a high pass filter followed by a separate peak detector measuring over a time interval. The carrier frequency calculator could be a table lookup, or a calculation, yielding a function of the two measures that is positive monotonic, and that meets the required maximum TSD objective.

As another example, the amplitude measurement block 62 and the frequency measurement block 64 could be replaced by a single fast-Fourier-transform (FFT) unit. Multiplicative taps could then be used to weight the absolute value, or the square (i.e. the power), of these FFT frequency bin outputs, with greater weights being given to the higher frequency bins. Finally, these results could be summed. It can be seen that this scheme yields a value that increases with amplitude, increasingly so for higher frequency components, and therefore forms a method for calculating the carrier frequency.

As a further example, the amplitude measurement block 62 and the frequency measurement block 64 could be replaced by a differentiator. (In a discrete-time implementation, this is simply a matter of subtracting the previous sample of x(t) from the current sample of x(t).) Such a unit gives an increased output when either the amplitude or the frequency at its input is increased, yielding a basis for calculating the carrier frequency.

These are just example implementations. Clearly, many variations on, and alternatives to, these implementations are possible.

In practice, TSDs below −200 dB are achievable, which is well below any real attainable thermal noise floor, and hence for all practical purposes zero sideband distortion may be achieved using the balanced BPFM scheme just outlined.

It should be noted that balanced BPFM has an advantage over many existing bipolar amplifiers in that it experiences zero crossover distortion, as there is no change in mode between positive and negative amplitude output.

In comparison with conventional binary switching amplifiers, based on PWM or SDM, BPFM—and particularly ABPFM—has the advantage of being substantially less affected by power supply noise than binary PWM and SDM amplifiers, for example, as the power rails are switched through to the output for only a small fraction of the total time.

We have so far presented this bipolar pulse frequency modulator as a system that directly outputs positive and negative pulses, of any shape, based on an input signal. As shown in FIG. 1, the modulator may include a controller 10 for producing control signals to trigger pulse generation in a separate power pulse generator 20. These control signals may trigger just the start of each pulse in the power pulse generator 20, if the power pulse generator can time its own active pulse period, or they may additionally signal the end of the active pulse period if the power pulse generator has no such independent active pulse period timing ability. In the latter case, an example control signal format could be a binary signal in which a positive edge denotes the start of the pulse, and the negative edge denotes the end. It is seen that the ideas presented above apply in full to such a form of the modulator.

There are now described various implementations of the controller 10, forming part of the balanced bipolar pulse frequency modulator. In these implementations the carrier frequency, expressed in terms of c(t), may be held at a fixed value, or adapted, for example using the scheme presented previously. Thus, the implementations presented do not directly output shaped pulses, but output control signals to trigger pulse generation in a later unit.

Figure 5:
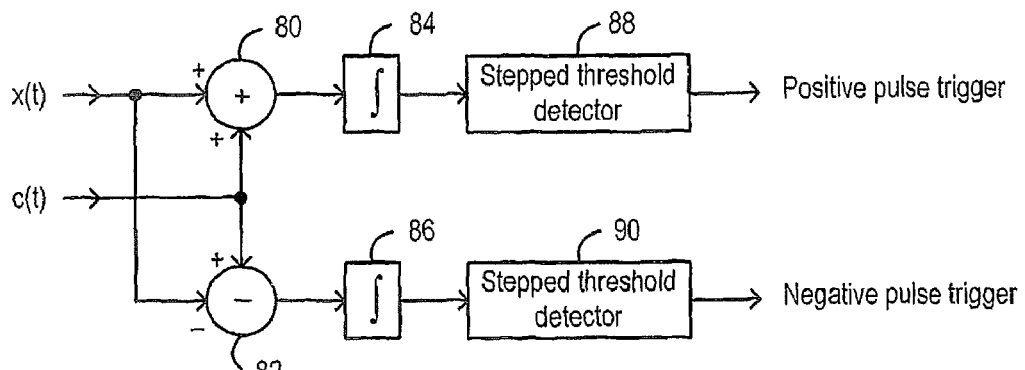
FIG. 5 is a block schematic diagram, illustrating a further component of the amplifier of the present invention.

FIG. 5 shows a possible continuous-time implementation, that could be implemented using analogue electronic components, for example. The required carrier frequency c(t) is applied to the respective first inputs of an adder 80 and a subtractor 82, while the input signal x(t) is applied to the respective second inputs of the adder 80 and the subtractor 82. Thus, the adder 80 calculates the frequency of the positive pulse stream, and the subtractor 82 calculates the frequency of the negative pulse stream.

The output of the adder 80 is passed to a first integrator 84, while the output of the subtractor 82 is passed to a second integrator 86. The two integrators 84, 86 perform frequency-to-phase conversion. They are the equivalent of the frequency-to-phase integrator found in a classic sinusoidal frequency modulator. It should be noted that the output of the integrators 84, 86 is positive monotonic with time.

Finally, the outputs of the two integrators 84, 86 are passed to respective first and second stepped threshold detectors (STD) 88, 90, which detect when the phase output of the respective integrator exceeds the next in a series of equally spaced phase thresholds. The difference between two consecutive phase thresholds represents one full pulse cycle, i.e. 360 degrees of phase. As each successive phase threshold is exceeded, a new pulse is triggered—the positive pulses being triggered by the first STD 88, and the negative pulses being triggered by the second STD 90.

If the two integrators 84, 86 in FIG. 5 are started with the same initial state (i.e. if they have the same integration constant), then the positive and negative pulses will be optimally aligned as described in the previous section. Furthermore, we may then implement the equivalent system shown in FIG. 6.

Figure 6:
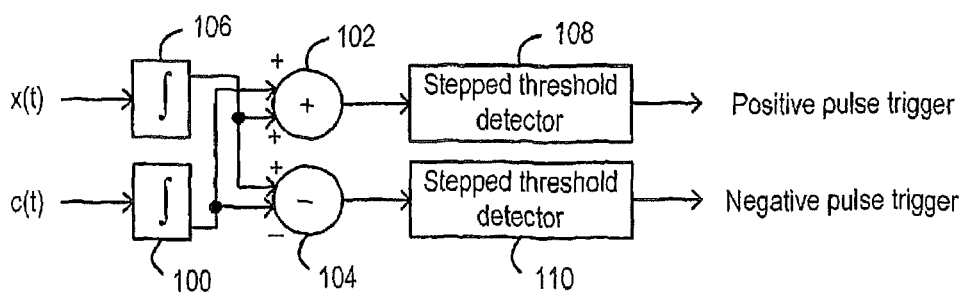
FIG. 6 is a block schematic diagram, illustrating a further component of the amplifier of the present invention.

In the system shown in FIG. 6, the required carrier frequency c(t) is applied to a first integrator 100, and the integrated carrier frequency signal is applied to respective first inputs of an adder 102 and a subtractor 104, while the input signal x(t) is applied to a second integrator 106, and the integrated input signal is applied to the respective second inputs of the adder 102 and the subtractor 104. Thus, with the integrators 100, 106 performing frequency-to-phase conversion, the adder 102 calculates the phase of the positive pulse stream, and the subtractor 104 calculates the phase of the negative pulse stream.

The outputs of the adder 102 and subtractor 104 are passed to respective first and second stepped threshold detectors (STD) 108, 110.

One issue in the systems of FIG. 5 and FIG. 6 is that at least some of the integrated results grow continually, namely the outputs of both integrators 84, 86 in FIG. 5, and the first integrator 100 in FIG. 6, and also the second integrator 106 in FIG. 6 unless x(t) has zero DC. In a real system these integrators would eventually hit limits, so the system must periodically subtract a known amount from the integrators, and take account of this in the STD.

Figure 7:
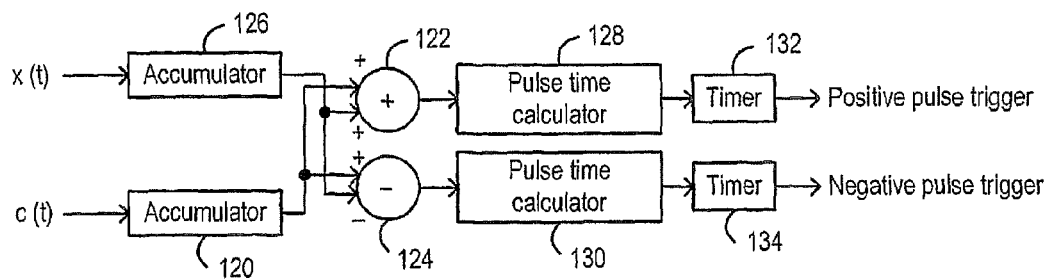
FIG. 7 is a block schematic diagram, illustrating a further component of the amplifier of the present invention.

A digital discrete-time implementation is shown in FIG. 7. The analogue adder, subtractor and integrators in FIG. 6 are straightforwardly replaced by a digital adder, subtractor and accumulators, respectively, as is customary for such analogue-to-digital system conversions. It will be apparent that an alternative digital discrete-time implementation can be obtained by making similar replacements of the analogue components in the system shown in FIG. 5.

Thus, the required carrier frequency c(t) is applied to a first accumulator 120, and the accumulated carrier frequency signal is applied to respective first inputs of an adder 122 and a subtractor 124, while the input signal x(t) is applied to a second accumulator 126, and the accumulated input signal is applied to the respective second inputs of the adder 122 and the subtractor 124.

The outputs of the adder 122 and the subtractor 124 are passed to respective first and second pulse time calculators 128, 130.

In FIG. 7, the accumulators 120, 126, the adder 122 and the subtractor 124 simply work at the sample rate of x(t). However, the BPFM pulse rate will frequently be higher than the sample rate of x(t), and so, for acceptable signal fidelity, the system must calculate the trigger time of the pulses to much higher precision than the sample period of x(t). Therefore, the system cannot simply compare the direct samples after the adder 122 and subtractor 124 against the next phase threshold, and trigger a pulse when it is exceeded. Rather, it is preferable to calculate more precisely a digital value for the pulse trigger time, whilst requiring low average computational complexity, and hence low power consumption.

In the embodiment shown in FIG. 7, the first and second pulse time calculators 128, 130 calculate values for the pulse trigger times to sufficient precision, and pass these to respective timers 132, 134, which produce the pulse triggers at the correct moments.

For the digital implementation presently considered, the most straightforward timer method is simply to use a digital counter to count the appropriate number of cycles of the main digital system clock between each trigger event. The main system clock will usually operate at a frequency significantly higher than the sample rate of x(t). Depending on the intended application, this clock frequency may be high enough to provide the required precision, or a more precise timer may be required, as described in more detail below.

It should be noted that the frequency-to-phase accumulators 120, 126 of FIG. 7 can be chosen to have higher precision than is available from the timers. This increases the precision of the final signal after the output filter, as the pulse jitter due to the lower precision of the timers is averaged by the output filter 30 in the amplifier show in FIG. 1. In the extreme, by increasing the accumulator precision as necessary, one can achieve a long-term average output of any chosen precision.

It should be noted that, in these discrete-time implementations, pulse frequency errors are lowest when the pulse frequency is low. This is another advantage of methods that keep the common mode frequency low, such as the semi-static and adaptive balanced techniques presented earlier.

As with the continuous-time implementations, in a real digital implementation it is necessary to prevent the values in the accumulators from growing beyond the available number range. Again, this is achieved by periodically subtracting a known value from the accumulators, and taking account of this in the pulse time calculator.

In some cases, the pulse-forming circuit driven by the modulator may not allow the positive and negative pulses to overlap. In such cases, extra processing is required after the pulse time calculators to ensure that overlap does not occur.

Figure 8:
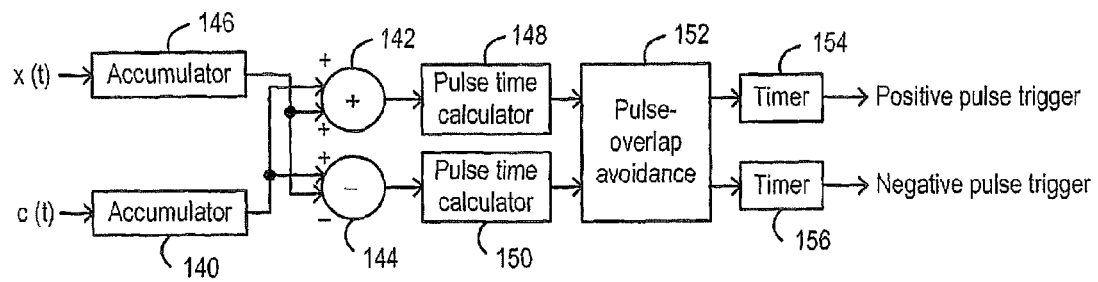
FIG. 8 is a block schematic diagram, illustrating a further component of the amplifier of the present invention.

FIG. 8 illustrates an embodiment of the invention in which this is taken into account. Thus, in FIG. 8, the required carrier frequency c(t) is applied to a first accumulator 140, and the accumulated carrier frequency signal is applied to respective first inputs of an adder 142 and a subtractor 144, while the input signal x(t) is applied to a second accumulator 146, and the accumulated input signal is applied to the respective second inputs of the adder 142 and the subtractor 144.

The outputs of the adder 142 and the subtractor 144 are passed to respective pulse time calculators 148, 150, as described above with respect to FIG. 7, and the calculated pulse times are passed to a pulse-overlap avoidance block 152, as described in more detail below.

The outputs from the pulse-overlap avoidance block 152 are then passed to respective timers 154, 156, which produce the pulse triggers at the correct moments.

The pulse-overlap avoidance block 152 uses prior knowledge of the fixed width of the positive and negative pulses to firstly determine if overlap would occur, and if so to, to adjust the timing of the positive and/or negative pulses so that they no longer overlap. One option is to adjust timing of the positive and negative pulses such that the two pulses have the same "centre of gravity" after the adjustment, in other words the mean time of the two pulses is remains unchanged. This is achieved simply by advancing the first pulse by time $T_o$, and retarding the second pulse by the same time $T_o$. The total time displacement of the two pulses with respect to each other, $2 \cdot T_o$, is chosen so as to avoid overlap of the pulses. It is found that this technique introduces minimal error to the signal.

Switching amplifiers, in common with types of other amplifier, sometimes employ negative feedback to reduce output errors. Negative feedback techniques are widely known. It is seen that, as with other amplifiers, negative feedback may be applied to the bipolar pulse frequency modulator just described, or to an amplifier of which the modulator is part.

We have assumed that the negative pulses of BPFM are identical but inverted versions of the positive pulses. However, if this is not the case, and the positive and negative pulses have different average amplitudes, the most significant effect is a DC offset on the final output waveform. This can be corrected for by the addition of a complementary DC term in the input signal, and negative feedback is clearly one way of achieving this.

It should be noted that BPFM can be implemented in a bridged configuration, such that one of the two pulse streams is applied to one terminal of a load, and the other is applied to the other terminal of the load. This allows a higher maximum power output, in that the maximum amplitude swing across the load is increased.

It may also be noted that the BPFM method could be extended to include not just two PFM pulse streams (one positive plus one negative, as has been presented), but any number of positive and negative PFM pulse streams summed together. In this case, the definition of the differential frequency can be generalized to be the difference between the sum of the positive pulse frequencies and the sum of the negative pulse frequencies.

Moreover, while the embodiments described so far relate to a modulator that generates at least one positive pulse stream and at least one negative pulse stream, an alternative form of the amplifier may have just one PFM pulse stream output.

Thus, referring back to FIG. 2, the modulator produces a single pulse stream, at a frequency that depends on the amplitude of the input signal. Again, the pulses may be sinusoidal, with the pulse generator 20 using the QRC technique.

The frequency of the pulses in the PFM pulse stream needs to be centred on a carrier frequency, allowing for positive and negative frequency excursions in response to the positive and negative amplitudes in the input signal. Thus, the frequency of the pulses in the PFM pulse stream can be regarded as the sum of this carrier frequency and a modulating frequency that depends on the amplitude of the input signal.

Figure 9:
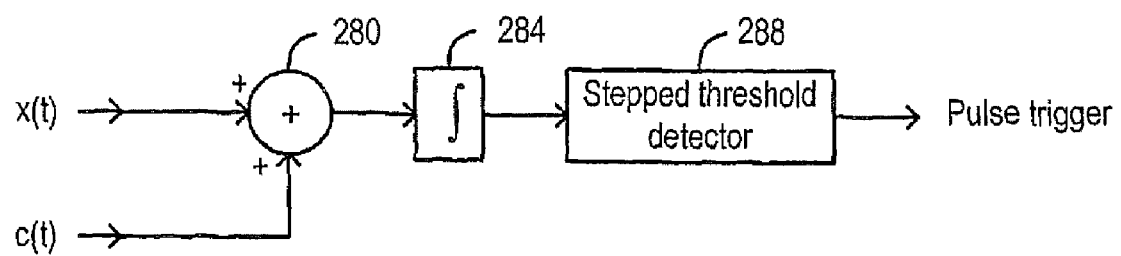
FIG. 9 is a block schematic diagram, illustrating a further component of the amplifier in another embodiment of the present invention.

FIG. 9 shows a possible continuous-time implementation that could be implemented using analogue electronic components, for example. The required carrier frequency c(t) is applied to the first input of an adder 280, while the input signal x(t) is applied to the second input of the adder 280. Thus, the adder 280 calculates the required frequency of the output pulse stream.

The output of the adder 280 is passed to an integrator 284. The integrator 284 performs frequency-to-phase conversion. The output of the integrator 284 is passed to a stepped threshold detector 288, which detects when the phase output of the integrator exceeds the next in a series of equally spaced phase thresholds. The difference between two consecutive phase thresholds represents one full pulse cycle, i.e. 360 degrees of phase. As each successive phase threshold is exceeded, a new pulse is triggered.

Figure 10:
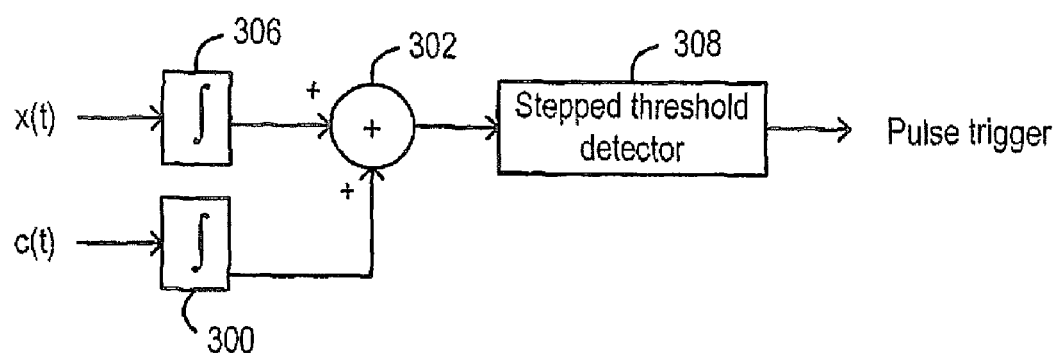
FIG. 10 is a block schematic diagram, illustrating a further component of the amplifier in another embodiment of the present invention.

In the system shown in FIG. 10, the required carrier frequency c(t) is applied to an integrator 300, and the integrated carrier frequency signal is applied to the first input of an adder

302, while the input signal x(t) is applied to a second integrator 306, and the integrated input signal is applied to the second input of the adder 302. Thus, with the integrators 300, 306 performing frequency-to-phase conversion, the adder 302 calculates the phase of the pulse stream.

The output of the adder 302 is passed to a stepped threshold detector 308.

One issue in the systems of FIG. 9 and FIG. 10 is that at least some of the integrated results grow continually. These integrators will eventually hit limits, so the system must periodically subtract a known amount from the integrators, and take account of this in the stepped threshold detector.

Figure 11:
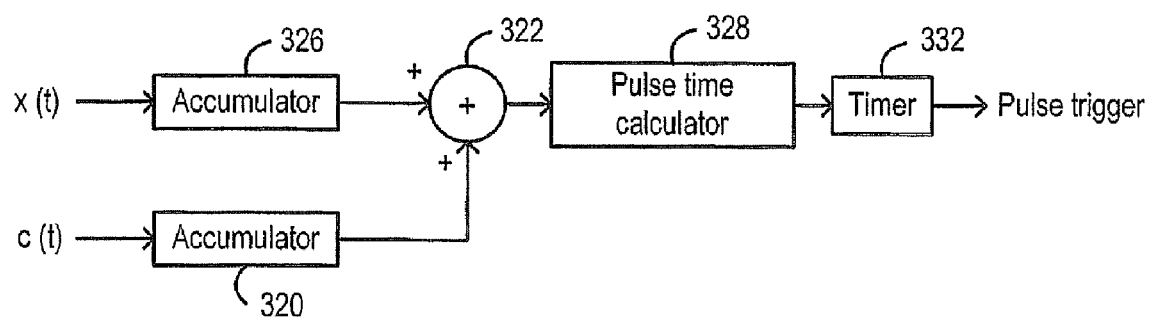
FIG. 11 is a block schematic diagram, illustrating a further component of the amplifier in another embodiment of the present invention.

A digital discrete-time implementation is shown in FIG. 11. The analogue adder and integrators in FIG. 10 are straightforwardly replaced by a digital adder and accumulators, respectively, as is customary for such analogue-to-digital system conversions. It will be apparent that an alternative digital discrete-time implementation can be obtained by making similar replacements of the analogue components in the system shown in FIG. 9.

Thus, the required carrier frequency c(t) is applied to a first accumulator 320, and the accumulated carrier frequency signal is applied to the first input of an adder 322, while the input signal x(t) is applied to a second accumulator 326, and the accumulated input signal is applied to the second input of the adder 322.

The output of the adder 322 is passed to a pulse time calculator 328. The pulse time calculator 328 calculates values for the pulse trigger times to sufficient precision, and passes these to a timer 332, which produces the pulse triggers at the correct moments.

The presence of the carrier means that there is a consequent DC component in the PFM pulse stream, in addition to the frequency components due to the wanted signal. In many applications (e.g. an audio amplifier driving a moving-coil loudspeaker), this DC component must be removed before being applied to the load.

In order to remove the DC component, the power pulse generator may be designed to output the PFM pulse stream with a negative DC offset, i.e. such that between pulses a negative voltage is produced, and during a pulse a positive voltage is produced. This negative DC offset can be arranged to exactly cancel the positive DC offset due to the carrier. The detailed design would be apparent to one skilled in the art. This alternating polarity pulse stream may then be applied to one terminal of a load, whilst the other terminal is held at zero amplitude ("ground").

As an alternative, a bridged output stage may be used. This would have two outputs, each driving one of the two terminals of a load. In one form, for example, the first output could apply the power pulses as already described, and the second output could apply identical power pulses but with an inverted amplitude. It can be seen that this would allow both positive and negative differential amplitudes to be applied across the load. Therefore, by appropriate choice of the carrier frequency $f_c$, DC may be eliminated. Furthermore, the amplifier may then benefit from the increased maximum power output available to bridged designs, as already noted for the bridged form of BPFM above.

As a further alternative, a means for blocking DC may be used, e.g. a capacitor in series with the amplifier's output (in electronic implementations of the amplifier). However, in practice this may lead to the need for a capacitor with a large value of capacitance, and capable of tolerating voltage of both negative and positive polarity.

In order to accommodate the largest possible positive and negative output swings from the amplifier, the carrier frequency, $f_c$, must be placed close to midway between zero and the maximum pulse frequency, $F_{max}$, that the modulator is capable of, i.e. such that $f_c$ approximately equals $F_{max}/2$. (For example, the chosen pulse-width, $T_w$, sets an upper limit on the pulse frequency of $1/T_w$.) This may lead to a high average switching rate, and hence high switching losses.

In order to counter this problem of a high switching rate, a means may be used to dynamically adapt $f_c$, such that lower values of $f_c$ are used for smaller signals at the input of the amplifier. This may comprise the scheme of FIG. 4, or any of the techniques already described regarding the operation of that scheme. However, varying $f_c$, even slowly, complicates the DC blocking considerations above, since it is now no longer actually DC that we need to block, but a low-frequency component. The capacitor-based scheme above could be used, but its effective frequency cut-off presents an additional constraint on the rate at which $f_c$ may be varied. Alternatively, dynamic means may be used to vary the countering DC offset in the other methods above.

As discussed above, in the digital systems of FIGS. 7, 8 and 11 the system needs to calculate the pulse trigger time to a high precision, with much higher resolution than a sample period of x(t). In the analogue systems of FIGS. 5, 6, 9 and 10, timing the pulse trigger is simply a matter of the system waiting until an analogue phase signal exceeds a fixed phase threshold. The continuous-time nature of the system puts no limits on the precision with which the trigger time is generated. In the digital case, however, it is significantly more difficult to determine a high precision and high accuracy digital value for the time at which the phase threshold is exceeded.

One option would be to simply up-sample the signal to a high sample rate, using well-known interpolation techniques. Then, the system could compare each of these interpolated samples to the phase threshold value, and, when the threshold is exceeded, the system would have determined the pulse trigger time to the precision of the new sample period. However, such a method implies a great deal of computational overhead, and hence extra power consumption. Such brute-force up-sampling calculates many values that are not needed, as only two interpolated samples are needed to bound the threshold crossing-point. Moreover, for low error interpolation, the optimal technique is the well-known sinc interpolation method; but this requires a number of multiply operations for every output sample, compounding the computation required.

In preferred embodiments of the invention, the pulse time calculators 128, 130 (in the FIG. 7 embodiment) or 148, 150 (in the FIG. 8 embodiment) or 328 (in the FIG. 11 embodiment) operate to calculate the pulse trigger time with high precision and high accuracy, but require much less computational effort than the brute-force sinc interpolation method just described. They employ an iterative method, with a variable number of iterations, that successively "fills in" more sinc interpolated samples until the algorithm decides that linear interpolation gives a sufficiently good approximation (i.e. it is acceptably close to the corresponding sinc result), at which point linear interpolation is performed and the algorithm terminates. Therefore, the method benefits from the high accuracy of sinc interpolation, and the high precision of linear interpolation. The second derivative of the curve is used as a measure of how "straight" the curve is in the local region, and is used to decide when to apply linear interpolation and terminate.

To facilitate explanation, the following assumes that the phase threshold for the pulse trigger is zero. It is seen that the method can readily be extended to work for any value of phase threshold, however; for example, by adding a constant value to the all input samples.

Consider four consecutive samples entering the pulse time calculator. Call them, in order:

$$y_{-3}, y_{-1}, y_{+1}, y_{+3}.$$

First, the system checks whether there is a zero-crossing between $y_{-1}$ and $y_{+1}$, i.e. whether $y_{-1}$ and $y_{+1}$ are of opposite sign. If not, the system terminates the algorithm and moves one sample along to process the next set of four samples; i.e. $y_{-1}$ becomes $y_{-3}$, $y_{+1}$ becomes $y_{-1}$, $y_{+3}$ becomes $y_{+1}$, and the next new sample is used as $y_{+3}$.

However, if $y_{-1}$ and $y_{+1}$ are of opposite sign, the system then calculates three first derivatives, as follows $$y'_{-2} = y_{-1} - y_{-3}$$

$$y'_{0} = y_{+1} - y_{-1}$$

$$y'_{+2} = y_{+3} - y_{+1}$$

Note that in our application of this algorithm we may actually omit the above calculations, as these derivatives equal the values fed into the integrator in FIGS. 7, 8 and 11, so our particular system may directly use them instead. The system then calculates two second derivatives, as follows $$y''_{-1} = y'_{0} - y'_{-2}$$

$$y''_{+1} = y'_{+2} - y'_{0}$$

If both of these values are below a given threshold, $y_{thresh}$, the system decides that the curve is locally "straight" enough for linear interpolation to be used, and terminates the algorithm; in which case the final activity is to perform the linear interpolation calculation, as follows $$t_{offset} = -y_{-1}/y'_{0}$$

where $t_{offset}$ is the pulse trigger time in terms of fractions of a sample period away from the centre of the period considered (i.e. the midpoint of $y_{-1}$ and $y_{+1}$).

Otherwise, i.e. if either second derivative is not below $y_{thresh}$, the system prepares to iterate the algorithm, as follows. The system applies sinc interpolation to interpolate a value at the midpoint between $y_{-1}$ and $y_{+1}$, referred to as $y_{0}$. (For acceptable results, the sinc interpolation calculation will typically require more input samples than just the four presently considered, so these must also be made available to the algorithm.) Then, if the system finds that the zero-crossing is bounded between $y_{0}$ and $y_{+1}$ (e.g. by testing for opposite sign, as above), it sinc interpolates a value at the midpoint between $y_{+1}$ and $y_{+3}$, referred to as $y_{+2}$. If it is not, the zero-crossing must be bounded between $y_{-1}$ and $y_{0}$, in which case the system sinc interpolates a value at the midpoint between $y_{-1}$ and $y_{-3}$, referred to as $y_{-2}$. In either case, we now have a run of four contiguous samples (a mixture of original samples and sinc interpolated samples) spaced at half the original sample period. These four samples can then be used to start a new iteration of the algorithm, i.e. they are used in place of the original $\{y_{-3}, y_{-1}, y_{+1}, y_{+3}\}$ above and the algorithm is re-started.

It can be seen that the algorithm can be allowed to iterate as many times as desired. However, if it has not terminated of its own accord after a certain number of iterations, termination may be forced.

When the algorithm does terminate, it is useful for the system to keep the calculated derivative values and sinc interpolation results, as they may be reused by the following pulse time calculation, yielding further savings in average computational load, and hence power consumption.

For the digital implementation presently considered, the timers 132, 134 (in the FIG. 7 embodiment) or 154, 156 (in the FIG. 8 embodiment) or 332 (in the FIG. 11 embodiment) can, in the most straightforward case, simply use a digital counter to count the appropriate number of cycles of the main digital system clock between each trigger event. The main system clock will usually operate at a frequency significantly higher than the sample rate of x(t). However, in some applications, such as audio, the main system clock frequency may not be high enough to offer the timing precision required to achieve the desired signal fidelity, especially as the requirement for low system power consumption tends to reduce the frequency chosen for the main system clock.

In the preferred embodiments, therefore, the timers 132, 134 (in the FIG. 7 embodiment) or 154, 156 (in the FIG. 8 embodiment) or 332 (in the FIG. 11 embodiment) operate in accordance with the following scheme, which provides a high precision, low power timer, that offers much higher timing precision than is typically available from a main digital system clock, allowing fidelity requirements to be met in these demanding applications.

There is thus described below a low power digital event timer that takes as input high precision digital time values, with higher resolution than the cycle period of the main digital system clock, and outputs timed event triggers with that precision. The timer has immediate application in the BPFM modulator presently considered, but it is also a more general method that could find application in any digital system that requires such a high precision event timer. One application, for example, would be in a digital PWM modulator, or digital PWM switched amplifier, where the timer could provide the basic pulse width timing to higher precision than the main digital system clock that is normally used, yielding lower errors at the final output.

Figure 12:
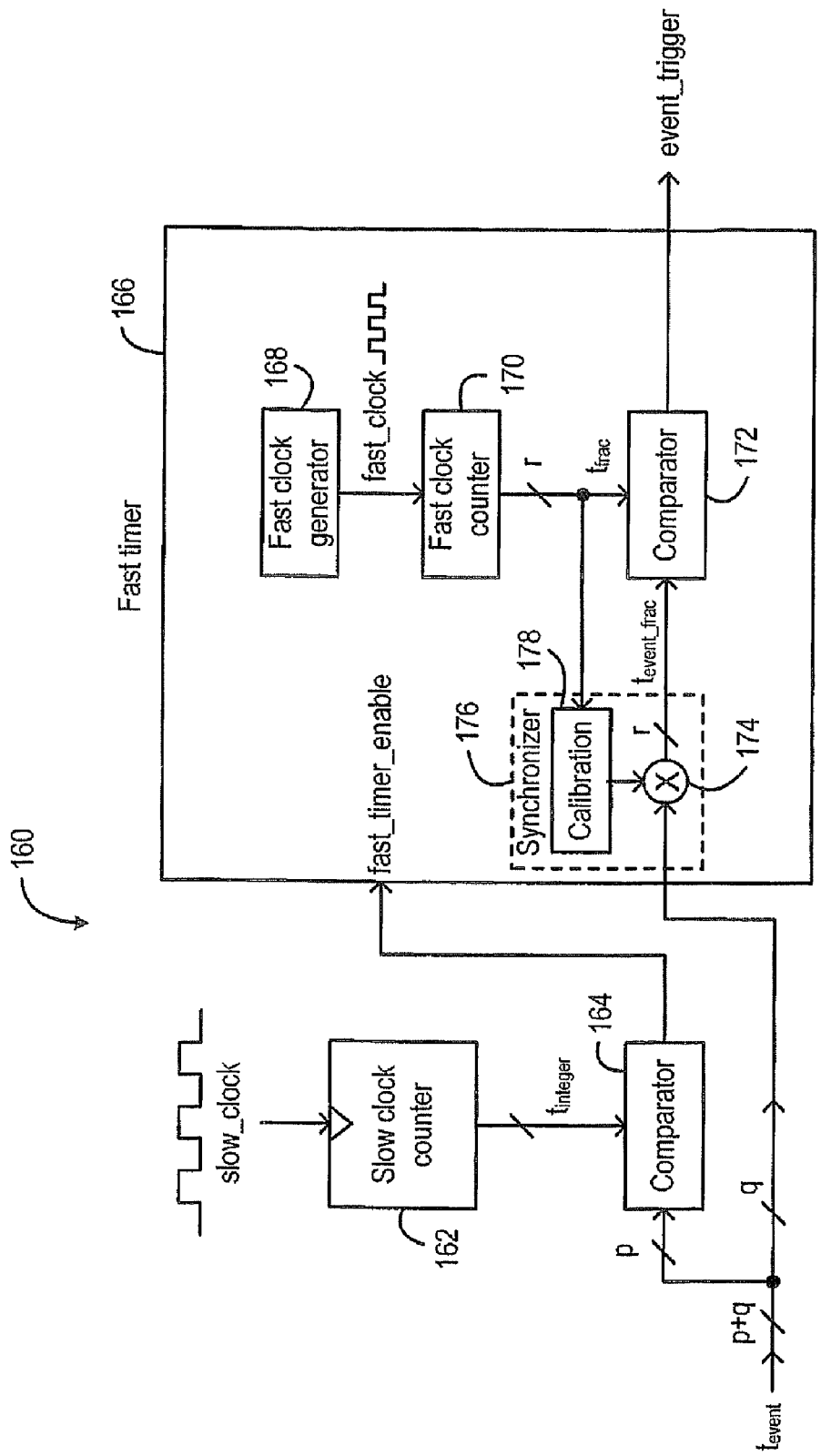
FIG. 12 is a block schematic diagram, illustrating a further component of the amplifier of the present invention.

FIG. 12 shows a timer in accordance with the preferred embodiment. The basic idea is to time most of the interval between events with a counter operating from the main system clock, yielding "coarse" timing, and to use a counter driven by a faster clock to make fine adjustments to that coarse timing. The clock generator for the faster clock, and its associated counter, are only enabled when needed, minimizing the average clock-line and data-line toggle rate of the overall timer circuit, and thus the power consumed. Allowance can be made for lack of synchronization, or drift, between the fast clock and the main system clock by means of an optional calibration scheme. Finally, a scheme is presented for the fast timer that offers very high precision and low power consumption.

In FIG. 12, an external (p+q) bit binary value, $t_{event}$, is supplied as input to the timer 160. The timer also receives the main system clock, slow_clock, as an input to a slow clock counter 162.

The upper p bits of the external binary value, $t_{event}$, are supplied to a comparator, which also receives the output of the slow clock counter 162.

When the comparator 164 detects a match between the upper p bits of the external binary value, $t_{event}$, and the output of the slow clock counter 162, a binary signal fast_timer_enable is sent to a fast timer 166.

The fast timer 166 includes a fast clock generator 168, which generates a fast clock signal. The fast clock signal is applied to an input of a fast clock counter 170, and the output of the fast clock counter 170 is applied to a first input of a further comparator 172.

The lower q bits of the external binary value, $t_{event}$, are supplied to a multiplier 174, forming part of a synchronizer 176 in the fast timer 166. The output of the fast clock counter 170 is also supplied to a calibration block 178 in the synchronizer 176. The output of the multiplier 174 is applied to a second input of the further comparator 172.

When the further comparator 172 detects a match between the output of the fast clock counter 170 and the output of the multiplier 174, a binary signal event_trigger is provided as an output of the timer 160.

In use of the timer 160, the external binary value, $t_{event}$, gives the time at which the event trigger should be fired. The upper p bits of $t_{event}$ give the time in terms of a number of whole cycles of the main system clock, slow_clock. For convenient explanation, we regard this as the integer component of time, as far as the timer is concerned. Likewise, we regard the lower q bits of $t_{event}$ as the fractional component of time, i.e. a component that represents less than one clock period of slow_clock. The lower q bits of $t_{event}$ form a conventional fixed-point binary extension of the upper p bits; i.e. they represent a value δ, where $0 \leq \delta < 1$. In the scheme of FIG. 9, the slow clock counter 162 provides the timing for the integer part of $t_{event}$, and the fast clock counter provides the timing for the fractional part.

The slow clock signal is assumed to be continuously running. The slow clock counter 162 also runs continuously, incrementing by one for each cycle of slow_clock, and wrapping back to zero after reaching its highest value, as is normal behaviour for a counter. When the binary signal fast_timer_enable is held low, which is the normal condition, the fast timer circuit 166 is disabled and held in an inactive state. This may be achieved simply by holding the fast clock generator 168 in an inactive state.

The slow clock counter 162 outputs a p-bit binary number, $t_{integer}$, that counts integer time. The digital comparator 164 detects when $t_{integer}$ equals the value represented by the upper p bits of $t_{event}$. If they are equal, the comparator 164 raises the binary signal fast_timer_enable for one clock period of slow_clock. This enables the fast timer 166.

When the fast timer 166 is enabled, the fast clock generator 168 starts producing a high frequency square-wave signal, fast_clock, that drives the fast clock counter 170. This counter starts from zero (for example, it may be reset by fast_timer_enable being brought low) and increments by one for each cycle of fast_clock. It never reaches the end of its counting range, or wraps, however, as its bit-width r is chosen so that this cannot occur within the single cycle period of slow_clock for which it is active. The fast clock counter 170 outputs a r-bit binary number, $t_{frac}$, that is fed into the further digital comparator 172. This further comparator 172 detects when $t_{frac}$ reaches a value, $t_{event\_frac}$, that marks the correct moment to fire the event trigger, at which point the comparator 172 signals the event with a transition of the binary signal event_trigger. To save power, the fast timer circuitry may then be returned to the inactive state.

The method just outlined is based on activating the fast timer 166 for up to one clock cycle of slow_clock. Alternatively, it can be seen that the method could straightforwardly be modified to work with half cycle periods of slow_clock, for example by using a "double-edge" triggered counter, i.e. a counter that increments by one for every positive and negative edge of fast_clock. However, in this case care must be taken that duty cycle of slow_clock is close to fifty percent. The value of $t_{event\_frac}$, and how it is derived from $t_{event}$, depends on the system configuration.

In the simplest system configuration, the fast clock generator 168 is synchronized to slow_clock such that fast_clock is $2^q$ times the frequency of slow_clock. In this case, the synchronizer 176 including the multiplier 174 and calibration unit 178 can be omitted, and $t_{event\_frac}$ simply equals the lower q bits of $t_{event}$. It is seen that this system can time to the full resolution of $t_{event}$, as required.

In a second system configuration there is no requirement for a $2^q$ frequency multiple between slow_clock and fast_clock. However, for this configuration we still assume that the two clock regimes are synchronized, with fast_clock operating at $k_{fs}$ times the frequency of slow_clock. In this case, the calibration unit 178 can be omitted, but the multiplier 174 is required, to correct for the non-power-of-two relationship by multiplying the lower q bits of $t_{event}$ by the constant $$k_{fs}/2^q$$

to yield $t_{event\_frac}$, as required. For these synchronized configurations, one type of circuit suitable for the fast clock generator 168 would be a phase locked loop (PLL). Some types of fast clock generator circuit, like the PLL, may need extra time to activate and reach a stable state before they can be used to drive the fast clock counter 170. In that case, it is straightforward to arrange for the fast clock generator 170 to be activated early, by one or more cycles of slow_clock, but with the fast clock counter 170 being held inactive until the normal active cycle described above.

In a third system configuration, slow_clock and fast_clock are not synchronized, and there may be slow variation ("drift") in the frequency multiple $k_{fs}$. In this case, a calibration scheme may be used to dynamically set $k_{fs}$ at the start of operation, and periodically update it to take account of any drift. The scheme operates as follows. At start-up, the fast_timer_enable signal is raised for one clock cycle of slow_clock. The fast clock counter 170 runs for the whole cycle, and at the end its value, which is an empirical measure of $k_{fs}$, is stored in the calibration unit 178 of FIG. 12. The calibration unit 178 then presents the value $k_{fs}/2^q$ to the multiplier 174, to yield the required value of $t_{event\_frac}$. This calibration process may be carried out periodically, to track any drift in $k_{fs}$. During the calibration cycle, event_trigger is not fired (e.g. by setting $t_{event\_frac}$ to a high value that cannot occur).

Figure 13:
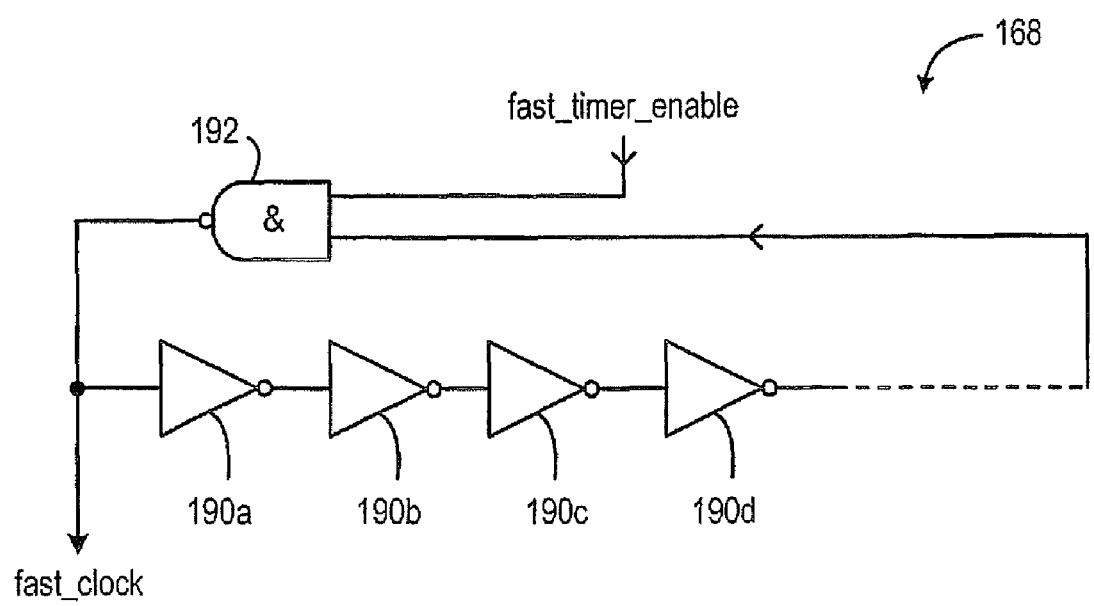
FIG. 13 is a block schematic diagram, illustrating a further component of the amplifier of the present invention.

For this non-synchronized case, FIG. 13 shows one possible circuit arrangement for the fast clock generator 168. Specifically, the fast clock generator 168 is in the form of a ring oscillator, a known oscillator circuit consisting of an odd number of inverters 190a, 190b, 190c, 190d etc arranged in a ring, plus a gating element 192 to start and stop the oscillations. The gating element shown is a NAND gate 192, which acts both as a gate to start and stop the oscillations, by receiving the fast_timer_enable signal, and also as one of the inverters in the ring. However, it should be noted that many other types of two-input logic gate can be used to provide the gating instead, taking appropriate account of signal inversions.

It should be noted that, if the number of inverters in the ring oscillator is reduced (keeping an odd total number), the frequency of oscillation is increased, thus increasing the precision of the timer. However, this leads to proportionally higher power consumption in the fast clock counter 170, which may be undesirable. Moreover, there is an upper limit to the frequency at which the counter will operate. The fastest possible ring oscillator comprises just one inverting element (for example, just the NAND gate in FIG. 13), which could potentially yield extremely high timing resolution, down to the propagation time of a single inverting element, $t_{inv}$. However, the frequency, $1/t_{inv}$, would be much too high for a real binary counter to operate. It should be noted that the power consumed by a ring oscillator is, to a good approximation, independent of the number of inverting elements, as the total toggle rate of the circuit remains at $1/t_{inv}$ for any number of elements.

Figure 14:
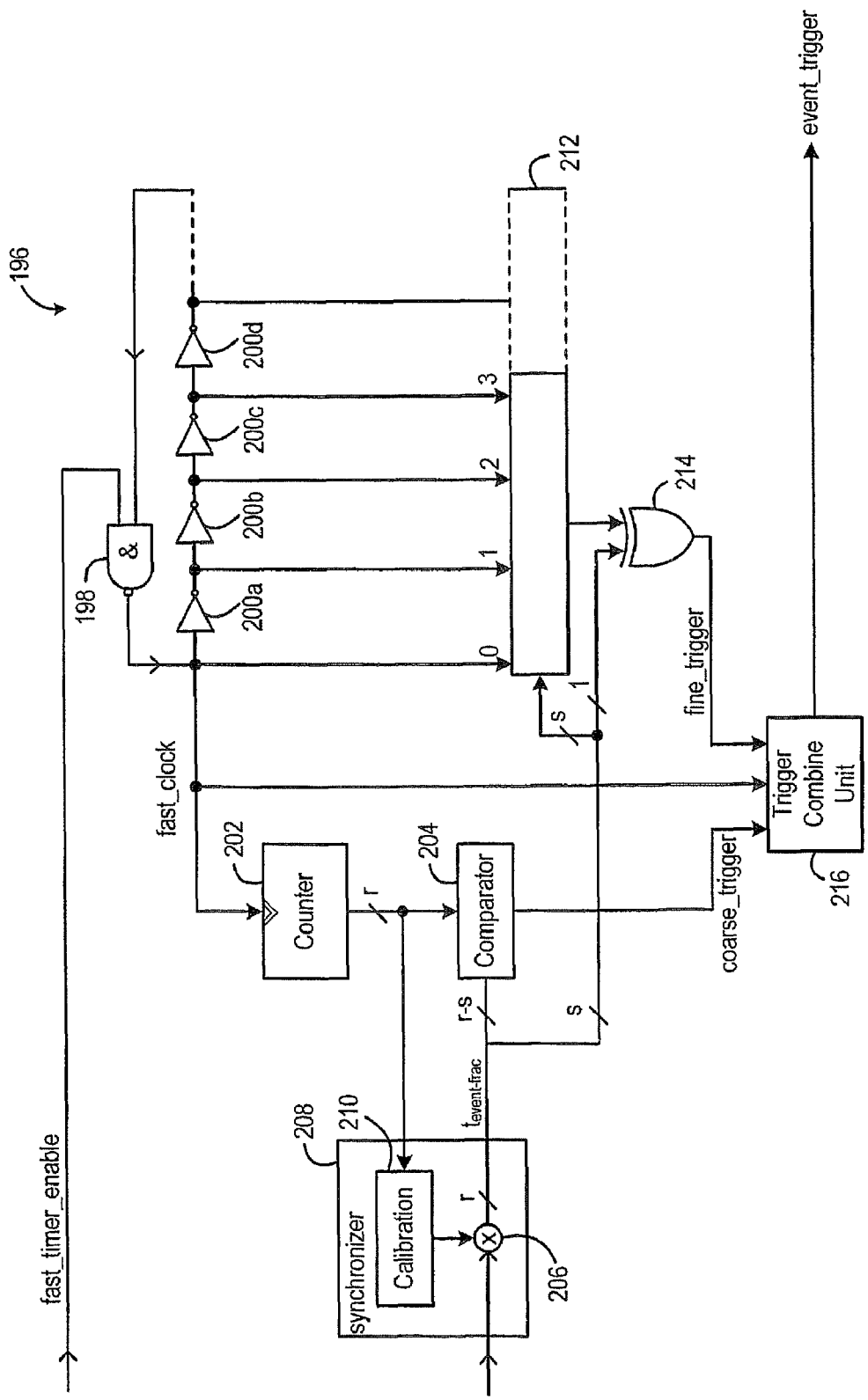
FIG. 14 is a block schematic diagram, illustrating a further component of the amplifier of the present invention.

FIG. 14 illustrates an alternative embodiment of the fast timer 166, in the embodiment shown in FIG. 12. In this fast timer 196, as in FIG. 13, the fast_timer_enable signal is applied to a NAND gate 198 forming part of a ring oscillator formed from inverters 200a, 200b, 200c, 200d etc. The fast_clock signal is provided at the output of the NAND gate 198, and is applied to a counter 202, with the output of the counter 202 being applied to a comparator 204.

The lower q bits of the external binary value, $t_{event}$, are supplied to a multiplier 206, forming part of a synchronizer 208 in the fast timer 196. The output of the counter 202 is also supplied to a calibration block 210 in the synchronizer 208. The output of the multiplier 206 is an r bit binary number, the upper (r-s) bits of which are applied to a second input of the comparator 204.

The outputs of the NAND gate 198, and of the inverters 200a, 200b, 200c, 200d etc, are applied to respective inputs of a multiplexer 212, which also receives the lower s bits of the output of the multiplier 206 as a select input. The lowest bit of the output of the multiplier 206, and the output of the multiplexer 212 are also applied to an XOR gate 214.

The fast_clock signal, and the output from the comparator 204 and the XOR gate 214 are applied to a trigger combine unit 216, which can provide the output event_trigger signal.

The fast timer 196 of FIG. 14 will now be described, assuming, for ease of explanation, that the counter 202 is "double-edge" triggered, i.e. that it increments by one for every positive and negative edge of fast_clock. The ring oscillator may have any odd number of inverting elements 198, 200a, 200b, 200c, 200d, etc, but will be described on the assumption that it has $2^s+1$ elements, where s is an integer. The more inverting elements it has, the slower the counter is clocked, and thus the lower the power consumed by the overall timer circuit. This provides the implementer with a choice regarding power consumption versus physical size of the circuit. The number of inverting elements does not affect the timer's resolution, which is $t_{inv}$.

In FIG. 14, the calibration unit 210, multiplier 206, counter 202 and comparator 204 operate in essentially the same way as their counterparts in the fast timer 166 of FIG. 12, the difference being that only the upper r-s bits of $t_{event\_frac}$ are used by the comparator 204. This part of the circuit provides timing to the granularity of $t_{inv} \cdot (2^s+1)$, raising the signal coarse_trigger when the counter reaches the value on the upper r-s bits of $t_{event\_frac}$.

The lower s bits of $t_{event\_frac}$ are fed into the select input of the multiplexer 212, and the lowest bit of $t_{event\_frac}$ may also be fed into the XOR gate 214, as shown, although this is optional. The purpose of the multiplexer 212 is to "tap off" a signal point in the chain of inverters in the ring oscillator, so as to observe an appropriately delayed transition after the last transition on fast_clock, timed to the granularity of $t_{inv}$. The inputs of the multiplexer are enumerated 0 to $2^s-1$, as shown in FIG. 14, corresponding to the same value on the multiplexer's select input.

The purpose of the XOR gate 214 is to compensate for the alternate inversion of the outputs moving along the inverter chain. Thus, a rising edge on fast_clock will always correspond to an appropriately delayed rising edge on the output of the XOR 214, fine_trigger, and similarly a falling edge on fast_clock will always correspond to an appropriately delayed falling edge on fine_trigger. Alternatively, the XOR gate 214 may be omitted and equivalent functionality included in the following trigger combine unit 216.

The purpose of the trigger combine unit 216 in FIG. 14 is to combine the coarse_trigger and fine_trigger signals, and output the final combined trigger as a single transition on event_trigger at the correct moment. The trigger combine unit 216 also has to take into account any real circuit propagation delays as needed.

In more detail, the trigger combine unit 216 outputs a transition on event_trigger when three events have been observed in sequence: (1) a rising edge on coarse_trigger, (2) the following edge on fast_clock, (3) the following edge on fine_trigger. There are many specific circuits that can realize this behaviour. A specific example is not given here, but an appropriate circuit solution will be clear to a person skilled in the art. Step (2) is needed on account of the propagation time of the counter and comparator, and the fact that we may have missed the associated fine_trigger edge in the current half cycle. Care is needed in dealing with the timing of steps (2) and (3), so that the trigger combine unit 216 is ready to detect the edge on fine_trigger neither too late nor too soon, but this is just a matter of engineering for circuit delays in a manner that will be clear to a person skilled in the art.

It may be noted that, in the scheme just presented, there is a "gap" in the available trigger times due to the fact that there are $2^s+1$ inverter delay elements in the ring oscillator, but the multiplexer gives access to only $2^s$ of them. This issue may either be tolerated (the error diminishes as s is increased), or it may be fully corrected for by adding appropriate delays between the inverter outputs and the multiplexer 212, with the delay increasing on each successively numbered multiplexer input. For example, a buffer could be added between each inverter output and the corresponding input of the multiplexer 212. The delay of each buffer could then be set, as required, by loading its output with an appropriate capacitance, for example.

Alternatively, the gap problem may be corrected by using a separate chain of $2^s$ inverters, rather than the inverters of the ring oscillator itself, to drive the $2^s$ multiplexer inputs. The inverters in this chain may then be arranged to each have a delay that is just slightly longer than inverters in the ring oscillator, by a factor of $(2^s+1)/2^s$, thus solving the timing gap issue. Again, the inverter delays may be set by appropriate capacitative loading, for example.

As mentioned above, the system as described so far uses a double-edged clocking scheme. However, it is possible to modify the system to use singled-edged clocking. In this case, we need to deal with the issue that two transitions propagate around the ring oscillator for each increment of the counter, namely one "positive" transition around the ring for each rising edge of fast_clock, and one "negative" transition for each falling edge, rather than one. Therefore, for each period of the counter, there are now twice as many transitions within the ring oscillator to take account of, so the first modification is to supply s+1 bits, rather than s, to the circuitry that produces fast_clock. Two methods are now presented for modifying that circuitry to handle the extra bit. The first method is to double the number of switched inputs to the multiplexer from $2^s$ to $2^{s+1}$, supplying the select input with the lower s+1 bits of $t_{event\_frac}$, and driving the switched inputs with a separate chain of $2^{s+1}$ inverters, appropriately timed as outlined above. The second method is to leave the multiplexer unchanged, with the same $2^s$ inputs still driven by the ring oscillator inverters, as shown in FIG. 14, and with its select input still driven by just the lower s bits of $t_{event\_frac}$; but to modify the trigger combine unit 216 so that it now waits for these three events: (1) a rising edge on coarse_trigger, (2) the following rising edge on fast_clock (assuming the active clock edge is the rising edge), (3) either the rising, or falling, edge of fine_trigger depending on whether the bit s (enumerating from 0) of $t_{event\_frac}$ is 0 or 1, respectively.

For convenient explanation, the scheme of FIG. 14 was presented as requiring $2^s+1$ inverters in the ring oscillator. However, any odd number of inverting elements may be used if the lower s bits (or s+1 bits in the single-edged clocking case) of $t_{event\_frac}$ are first multiplied by a constant, in the same manner as the scaling multiplier of FIG. 12.

Other possible modifications will be immediately apparent. For example, one could omit every other tap into the multiplexer, for coarser timing resolution. Similarly, the counters in any of the schemes presented may count down, rather than up, to achieve the same effect. Enumerations other than a simple counting sequence could be used, such as linear feedback shift register (LFSR) based sequences, Galois fields or Gray codes, for example. It is seen that none of these modifications changes the essential ideas just presented.

The scheme of FIG. 14 has been presented as a possible method for the fast timer in FIG. 12, but clearly it also has utility as an independent high precision timer in its own right, suitable for application in any digital system that requires such a high precision event timer. Thus, in the case of the modulators described above, the events to be timed are the positive pulse and negative pulse start triggers output by the systems of FIGS. 7 and 8 and the pulse start triggers output by the system of FIG. 11. Additionally, if the later pulse generation unit cannot independently time its active pulse-width, then the timer can also time the pulse stop instants. However, the timer can be used as a general-purpose event timer, and the event can then be any event triggered by a binary signal.

In the modulators described above, the pulse time calculators (see FIGS. 7, 8 and 11) may calculate the pulse trigger times with respect to a timing domain other than the slow_clock signal. For example, the pulse time calculators 128, 130, 148, 150, 328 described above calculate the pulse trigger times with respect to the sample periods of x(t). It is seen that, in order to convert these trigger time values to periods of slow_clock, the system simply needs to multiply the values by the ratio of the slow_clock frequency to the x(t) sample clock frequency.

There is thus described a general scheme for a bipolar pulse frequency modulator. The modulator can be used in a switching amplifier with any desired form of power pulse generator, although it is particularly suitable for use with a quasi-resonant converter for power pulse formation. However, the modulator could also include a non-QRC power stage.

Similarly, although the preferred embodiment of the invention is a modulator, for use in a switching amplifier, and includes particular embodiments of the pulse time calculator and the event timer, the pulse time calculator and the event timer can be used in other types of modulator, or switched amplifier, or indeed in completely unrelated applications.

The invention claimed is:

1. A modulator, for use in a switching amplifier, the modulator comprising:
a pulse generator that is operable to supply a composite pulse stream, wherein the composite pulse stream contains:
positive pulses that include positive mean amplitudes and having a controllable first pulse frequency, and
negative pulses that include negative mean amplitudes and having a second pulse frequency that is controllable independently of the first pulse frequency.

2. A modulator as claimed in claim 1, comprising:
an input for receiving an input signal; and
means for controlling the pulse generator based on an amplitude of the input signal, such that a pulse frequency difference, defined by a difference between the first pulse frequency and the second pulse frequency, produces a desired average pulse amplitude.

3. A modulator as claimed in claim 2, wherein the means for controlling the pulse generator operates such that an average pulse frequency, defined by a mean of the first pulse frequency and the second pulse frequency, is minimized, while maintaining an acceptable level of distortion of the input signal when the composite pulse stream is applied to a low pass filter.

4. A modulator as claimed in claim 3, comprising:
means for receiving an input signal;
means for receiving an average pulse frequency signal;
means for forming a sum and a difference of the input signal and the average pulse frequency signal;
means for integrating said sum and said difference;
means for generating a positive pulse trigger signal when the integrated sum reaches a respective predetermined threshold; and
means for generating a negative pulse trigger signal when the integrated difference reaches a respective predetermined threshold.

5. A modulator as claimed in claim 3, comprising:
means for receiving an input signal;
means for receiving an average pulse frequency signal;
means for integrating the input signal and the average pulse frequency signal;
means for forming a sum and a difference of said integrated input signal and said integrated average pulse frequency signal;
means for generating a positive pulse trigger signal when said sum reaches a respective predetermined threshold; and
means for generating a negative pulse trigger signal when said difference reaches a respective predetermined threshold.

6. A modulator as claimed in claim 3, comprising:
means for receiving an input signal;
means for receiving an average pulse frequency signal;
means for forming a sum and a difference of the input signal and the average pulse frequency signal;
means for accumulating values of said sum and said difference;
means for determining a time for generating a positive pulse trigger signal based on the accumulated values of said sum;
means for determining a time for generating a negative pulse trigger signal based on the accumulated values of said difference; and
means for generating said positive and negative pulse trigger signals.

7. A modulator as claimed in claim 3, comprising:
means for receiving an input signal;
means for receiving an average pulse frequency signal;
means for accumulating the input signal and the average pulse frequency signal;
means for forming a sum and a difference of said accumulated input signal and said accumulated average pulse frequency signal;
means for determining a time for generating a positive pulse trigger signal based on said sum;
means for determining a time for generating a negative pulse trigger signal based on said difference; and
means for generating said positive and negative pulse trigger signals.

8. A modulator as claimed in claim 6, further comprising a pulse overlap avoidance unit, for determining times for generating said positive pulse trigger and said negative pulse trigger, such that said positive pulses and said negative pulses do not overlap.

9. A modulator as claimed in claim 6, wherein said means for determining times for generating said positive pulse trigger and said negative pulse trigger employ linear interpolation between supplied samples to determine times at which thresholds are crossed.

10. A modulator as claimed in claim 1, wherein said positive pulses and said negative pulses are rectangular pulses.

11. A modulator as claimed in claim 1, comprising means for using quasi-resonant conversion to form said positive pulses and said negative pulses.

12. A switching amplifier, comprising:
a modulator that is operable to receive an input signal, wherein the modulator includes a pulse generator that is operable to supply a composite pulse stream, wherein the composite pulse stream contains positive pulses having positive mean amplitudes and having a controllable first pulse frequency, and negative pulses having negative mean amplitudes and having a second pulse frequency that is controllable independently of the first pulse frequency; and
a filter, wherein the composite pulse stream is applied to the filter, such that an output signal of the filter is an amplified version of said input signal.

13. A switching amplifier as claimed in claim 12, wherein the modulator comprises means for controlling the pulse generator such that a pulse frequency difference, defined by a difference between the first pulse frequency and the second pulse frequency, produces a desired amplitude at the output of the filter.

14. A switching amplifier as claimed in claim 13, wherein the means for controlling the pulse generator operates such that an average pulse frequency, defined by a mean of the first pulse frequency and the second pulse frequency, is minimized, while maintaining an acceptable level of distortion in said amplified version of said input signal.

15. A method of operation of a switching amplifier, the method comprising, in response to an input signal:
generating positive pulses having positive mean amplitudes and having a controllable first pulse frequency;
generating negative pulses having negative mean amplitudes and having a second pulse frequency that is controllable independently of the first pulse frequency;
combining the positive pulses and the negative pulses to form a composite pulse stream; and
applying the composite pulse stream to a low pass filter, such that an output of the filter is an amplified version of the input signal.

16. A method as claimed in claim 15, comprising setting the first pulse frequency and the second pulse frequency such that a pulse frequency difference, defined by a difference between the first pulse frequency and the second pulse frequency, produces a desired amplitude at the filter output.

17. A method as claimed in claim 15, comprising setting the first pulse frequency and the second pulse frequency such that an average pulse frequency, defined by a mean of the first pulse frequency and the second pulse frequency, is minimized, while the output of the filter forms an amplified version of the input signal with an acceptable level of distortion.

18. A method as claimed in claim 17, wherein distortion is measured with reference to a power of unwanted frequency components, relative to a power of a wanted signal.

19. A method as claimed in claim 16, comprising:
setting a base frequency;
setting one of the first pulse frequency and the second pulse frequency to be equal to the base frequency; and
setting the other of the first pulse frequency and the second pulse frequency to be greater than the one of the first pulse frequency and the second pulse frequency by said pulse frequency difference.

20. A method as claimed in claim 19, wherein the base frequency is fixed.

21. A method as claimed in claim 19, wherein the base frequency is variable.

22. A method as claimed in claim 16, comprising setting the first pulse frequency and the second pulse frequency such that the average pulse frequency is equal to a desired carrier frequency, and varying the first pulse frequency and the second pulse in anti-phase in order to maintain the desired pulse frequency difference.

23. A method as claimed in claim 22, wherein the carrier frequency is fixed.

24. A method as claimed in claim 22, wherein the carrier frequency is variable.

25. A method as claimed in claim 24, comprising:
forming a measure of at least one of an amplitude of an input signal and a frequency content of the input signal; and
determining the desired carrier frequency based on the measure of the amplitude of the input signal and/or based on the measure of the frequency content of the input signal.

26. A method as claimed in claim 25, wherein:
the measure of the amplitude of an input signal is formed from a measure of a peak amplitude of the input signal within a preceding time period;
the measure of the frequency content of the input signal is formed by detecting a peak in a high-pass filtered input signal; and
the desired carrier frequency is determined based on the measure of the amplitude of the input signal and based on the measure of the frequency content of the input signal.

27. A method as claimed in claim 25, comprising forming the measure of the amplitude of the input signal and forming the measure of the frequency content of the input signal by means of a Fast Fourier Transform.

28. A method as claimed in claim 25, comprising forming the measure of the amplitude of the input signal and forming the measure of the frequency content of the input signal by differentiating the input signal.

29. A method as claimed in claim 15, comprising phasing the positive pulses and the negative pulses such that, when the amplifier is in a resting state, they substantially coincide.

* * * * *

UNITED STATES PATENT AND TRADEMARK OFFICE
CERTIFICATE OF CORRECTION

PATENT NO. : 7,920,023 B2  
APPLICATION NO. : 12/440130  
DATED : April 5, 2011  
INVENTOR(S) : Witchard Page 1 of 1

It is certified that error appears in the above-identified patent and that said Letters Patent is hereby corrected as shown below:

On the Title Page:
Item (56) References Cited, U.S. Patent Documents, Line 5:
        Please correct "2005/1168205" to read -- 2005/0168205 --

Signed and Sealed this  
Ninth Day of August, 2011

David J. Kappos  
*Director of the United States Patent and Trademark Office*